United States Patent [19]

Clemens

[11] Patent Number: 4,712,159

[45] Date of Patent: Dec. 8, 1987

[54] HEAT SINK CLIP ASSEMBLY

[75] Inventor: Donald L. Clemens, The Colony, Tex.

[73] Assignee: Thermalloy Incorporated, Dallas, Tex.

[21] Appl. No.: 886,386

[22] Filed: Jul. 17, 1986

Related U.S. Application Data

[63] Continuation-in-part of Ser. No. 851,928, Apr. 14, 1986, abandoned.

[51] Int. Cl.[4] ............................................. H05K 7/20
[52] U.S. Cl. ................................. 361/386; 165/80.3; 174/16 HS; 357/81
[58] Field of Search ............... 361/386, 387, 388, 389; 174/16 HS; 165/80.1, 80.2, 80.3; 357/81

[56] References Cited

U.S. PATENT DOCUMENTS 2,772,382 11/1956 Escoffery ............................. 357/81
4,203,488 5/1980 Johnson et al ...................... 361/383

OTHER PUBLICATIONS

Habich, "Clip On Heat Sink," IBM Tech Disclosure Bulletin, vol. 24, No. 7B, 12/81, p. 3725.

Primary Examiner—J. R. Scott
Assistant Examiner—Morris Ginsburg
Attorney, Agent, or Firm—Kanz, Scherback & Timmons

[57] ABSTRACT

Disclosed is a heat sink clip assembly for releaseably attaching a heat sink to a DIP or similar electronic device package. The clip assembly includes a non-conductive attachment clip which extends between the leads on the underside of the DIP and means for latching the attachment clip to a heat sink disposed adjacent the opposite side of the electronic device package with the heat sink in intimate thermal contact with the electronic device package.

9 Claims, 15 Drawing Figures

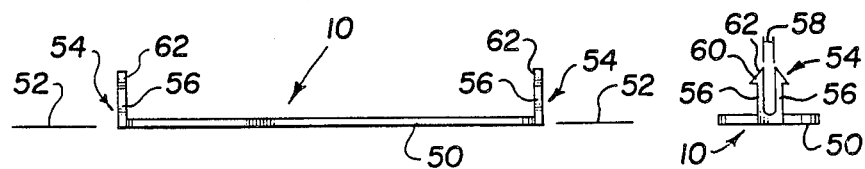
Fig. 5       Fig. 7
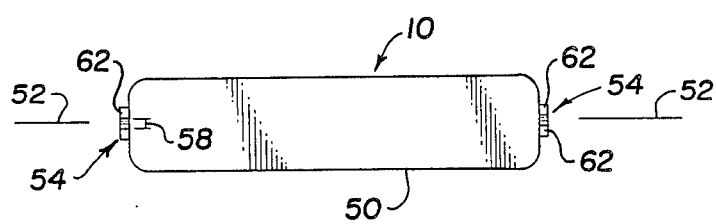
Fig. 6
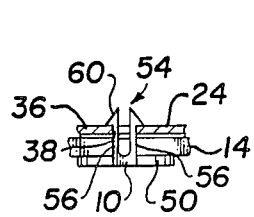  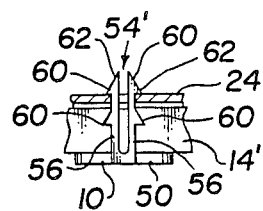
Fig. 8       Fig. 8A
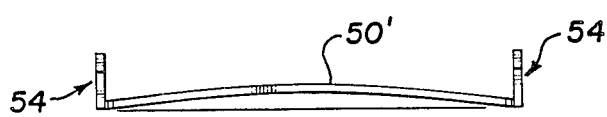
Fig. 9

HEAT SINK CLIP ASSEMBLY

This is a continuation-in-part of co-pending application Ser. No. 851,928 filed Apr. 14, 1986 and entitled Heat Sink Clip, now abandoned.

FIELD OF THE INVENTION

This invention relates to apparatus for securing a heat sink to an electronic device package. More particularly, it relates to clip fasteners for attaching heat dissipating devices to dual in-line device packages and the like.

BACKGROUND OF THE INVENTION

Various means have been used to attach heat sinks in intimate thermal contact with electronic device packages. For purposes of this disclosure, a heat sink is any body of metal or like material which is placed in contact with an electronic device package for transferring heat from the device contained in the device package and rapidly dissipating the heat to the atmosphere by conduction convection and/or radiation. For instance, it is known to glue or otherwise adhesively attach a heat sink to an electronic device package. However, assembly of the heat sink to the electronic device package is messy, tedious, labor intensive, requires accurate alignment of the parts. It is therefore expensive. Many commonly used adhesives emit fumes or otherwise constitute an undesirable health hazard. Frequently, it is necessary to cure the adhesive at elevated temperatures for extended periods of time, further increasing manufacturing costs. It is also sometimes desirable to remove the heat sink from the electronic device package for repair or replacement. This is extremely difficult, if not impossible, to accomplish when the heat sink is adhesively mounted on the electronic device package.

Heat sinks are also mechanically attached to electronic device packages such as by resilient metal clips mounted on the heat sinks which urge the heat sinks and the electronic device packages into mutual contact. The clip enables the heat sink to be easily removed from the electronic device package. However, this approach is undesirable in several respects. For instance, the clip relies solely on frictional engagement between the clip and the electronic device package to secure the heat sink thereto. Vibration, gravity or other mechanical forces may tend to loosen the heat sink from the electronic device package. Furthermore, since the heat sink is not positively locked into position on the electronic device package, there is a tendency for the clip to inadvertently contact the leads extending from the electronic device package and thereby create an electrical short between the leads. Generally, such clips are constructed so as to extend substantially the full length of the electronic device package. Therefore, the force urging the heat sink and the electronic device package together is applied at an end of the electronic device package rather than at an intermediate point where heat is being generated. This renders the heat sink less effective in dissipating heat from the electronic device package.

SUMMARY OF THE INVENTION

The present invention provides a heat sink clip assembly for attaching a heat sink to an electronic device package for dissipation of heat generated with in the electronic device package. The heat sink clip assembly includes an attachment clip, preferably constructed of electrically non-conductive material, placed on the underside of the electronic device package. Latching means are provided to mechanically connect the attachment clip to a heat sink placed in contact with the upper side of the electronic device package.

Among the principal features and advantages of this invention is the provision of an improved heat sink clip assembly which securely locks a heat sink in intimate thermal contact with a dual in-line package (DIP) without causing shorts between the leads extending from the electronic device package. Furthermore, the improved heat sink clip assembly of the invention is removeable from the heat sink and the electronic device package and is quickly and easily secured to the heat sink and electronic device package.

BRIEF DESCRIPTION OF THE DRAWINGS

So that the manner in which the above recited features and advantages of the invention, as well as others which will become apparent to those skilled in the art, are obtained and can be understood in detail, a more particular description of the invention briefly summarized above may be had by reference to the embodiments thereof illustrated in the accompanying drawings, which drawings form a part of the specification and in which like numerals depict like parts in the several views. It is noted, however, that the appended drawings illustrate only preferred embodiments of the invention and are therefore not to be considered limiting of its scope, for the invention may admit to other equally effective embodiments.

FIG. 5 is a side view of the attachment clip of FIG. 1.

FIG. 6 is a top view of the attachment clip of FIG. 5.

FIG. 7 is an end view of the attachment clip of FIG. 5.

FIG. 8 is a detailed view of the heat sink clip assembly of this invention attached to an electronic device package.

FIG. 8A is a detailed view of alternative embodiment of the attachment clip of this invention attached to an electronic device package.

FIG. 9 is a side view of another alternate embodiment of the attachment clip of this invention.

DETAILED DESCRIPTION OF THE INVENTION

Figure 1:
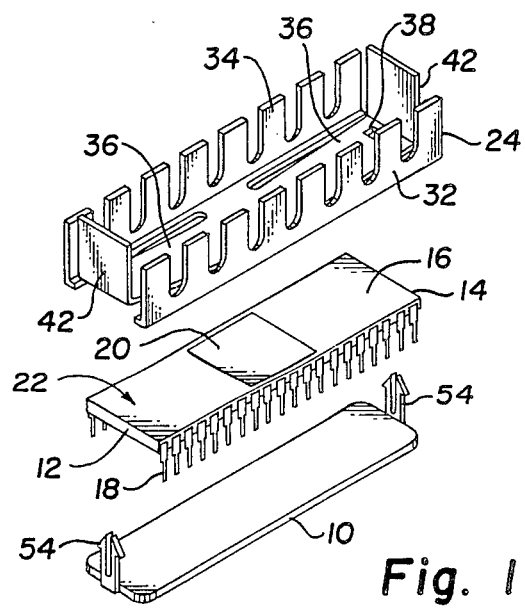
FIG. 1 is an exploded perspective view of an electronic device package and heat sink clip assembly according to the invention.

Referring now to FIG. 1, there is shown a heat sink clip assembly constructed according to the invention which includes attachment clip 10 adapted for placement adjacent underside 12 of electronic device package 14 containing a semiconductor device (not shown). In the illustrated embodiment the electronic device package is a DIP package carrying an integrated circuit device (not shown) within rectangular housing 16. A plurality of leads 18 extend downwardly in two parallel rows along the longitudinal edges of the electronic device package for connecting the integrated circuit to a circuit board (not shown) or other external circuit. Pad 20 is formed on upper side 22 of the integrated circuit housing and is in thermal contact with the integrated circuit device within the package for extracting heat generated by the integrated circuit device during use.

Figure 2:
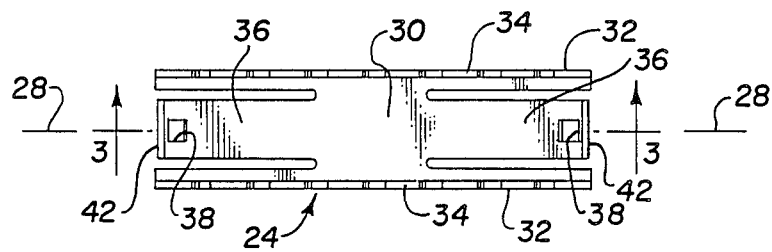
FIG. 2 is a top view of the heat sink of FIG. 1.
Figure 3:
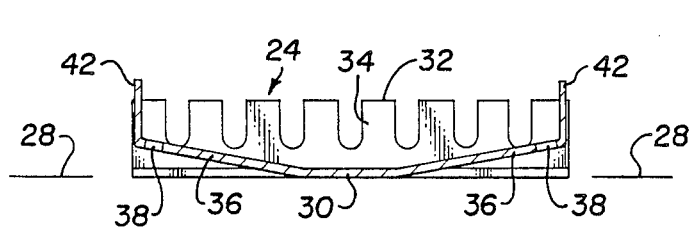
FIG. 3 is a cross-sectional view along plane 3—3 of the heat sink of FIG. 2.
Figure 4:
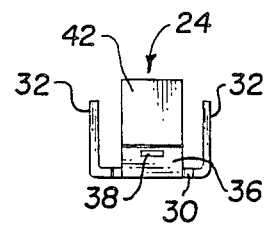
FIG. 4 is an end view of the heat sink of FIG. 2.

Heat sink 24 is adapted for placement adjacent the upper side of the electronic device package. Heat sink 24, shown in detail in FIGS. 2-4, extends along longitudinal axis 28 and includes a base 30 adapted for substantially co-extensive contact with pad 20 when the heat sink is located on the electronic device package. Some electronic device packages omit a pad and, in those cases, the base of the heat sink is placed directly on the upper side of the electronic device package adjacent the semiconductor device. A pair of parallel laterally spaced side walls 32 extend longitudinally from opposing side edges of the base of the heat sink. Each side wall includes a plurality of upwardly extending fingers 34 adapted for rapid dissipation of heat from the heat sink base. Of course, other heat sink configurations may be used as may be found effective with the electronic device package employed with this invention. When the heat sink base is placed in good thermal contact with the thermal pad of the electronic device package, heat generated by the integrated circuit device during use is conducted through the pad, heat sink base and the fingers in the side walls for rapid convection and/or radiation to the atmosphere. The heat sink may be anodized or otherwise surface treated to protect the heat sink from corrosion and to enhance the thermal dissipation characteristics of the heat sink.

Attachment clip 10 is shown in detail in FIGS. 5-7. The attachment clip includes generally rectangular body 50, preferably constructed of flexible and resilient material having high strength. The attachment clip is also preferably constructed of electrically non-conductive material to eliminate the above discussed shorting problems associated with conventional metal clips. The material must be capable of withstanding for an extended period of time the elevated temperatures (i.e. 120°-125° C.) commonly experienced in an electronics environment. A wide variety of polymers such as nylon, polyphenylene (PPS) and polysulfone are suitable for use in constructing the attachment clip. Alternatively, the attachment clip may be constructed of a resilient metallic material and coated with electrically non-conductive material such as listed above to insulate the attachment clip from the leads of the electronic device package.

The body of the attachment clip extends along longitudinal axis 52 and is narrower than the housing of the integrated circuit so that the clip may be placed in contact with underside 12 of the housing between the parallel rows of leads 18 extending downwardly therefrom. Preferably, the width of the attachment clip body is sufficiently close to the distance between the parallel rows of leads 18 to laterally align the attachment clip with respect to the integrated circuit housing.

Means are also provided to latch the heat sink to the attachment clip and secure the heat sink in intimate thermal contact with the electronic device package. In the embodiment illustrated in FIGS. 1-8, the latching means includes a pair of longitudinally spaced barb members 54 projecting from body 50 of the attachment clip and preferably integrally formed therewith. The barb members are preferably positioned on the attachment clip body closely adjacent the ends of the electronic device package when the attachment clip is in position beneath the electronic device package so as to longitudinally align the attachment clip with respect to the electronic device package. Each barb member includes a pair of barb elements 56 symmetrical about longitudinal axis 52 of the attachment clip body and separated by a distance 58. Each barb element terminates in a barb 60. Each barb 60 includes a laterally facing inclined surface 62 preferably having a width no greater than one half the distance 58 separating the barb elements. Of course, the barbs may be constructed in other shapes and configurations as may be found effective.

The latching means further includes mounting flanges 36 extending longitudinally in opposite directions from the heat sink base intermediate the side walls thereof. Each mounting flanges includes a longitudinally aligned opening 38 (or, alternatively, a slot) formed therein. In the preferred embodiment the opposing mounting flanges are each inclined upwardly at an acute angle with respect to the heat sink base.

When the heat sink and the attachment clip are placed on opposite sides of the electronic device package with their longitudinal axes parallel as shown in FIG. 1 the barb members at each end of the attachment clip are vertically aligned with one of the openings in the mounting flanges of the heat sink. The attachment clip inherently acts to align the base of the heat sink with the pad on the electronic device package. In this position, the mounting flanges are simultaneously deflected downwardly so as to be generally parallel with the upper side of the electronic device package. Tabs 42 may be formed at the ends of the mounting flanges to assist in manually applying a force to the mounting flanges as they are deflected. The deflection of the mounting members brings each of the barb members on the attachment clip into engagement with the aligned opening in one of the mounting flanges. As the barb member is inserted into the opening, the oppositely facing inclined surfaces 62 on the barbs are forced inwardly toward each other. Once the barbs pass through the opening, the barb elements 56 resiliently spring back to the relaxed position illustrated in FIG. 8, thereby securing the heat sink to the attachment clip. It is possible to detach the heat sink from the electronic device package by manually deflecting the barb elements inwardly and passing the barb members downwardly out of engagement with the openings in the heat sink mounting flanges, thus disengaging the latching means.

In FIG. 8A an alternate embodiment of a barb member 54' is shown which includes barb elements 56, each having a second pair of bars 60 similarly formed with an inclined surface 62. The second set of barbs enables the attachment clip to accommodate electronic device packages of various thicknesses. For instance, it is known that electronic device packages constructed of plastic are generally thicker (as illustrated at 14' in FIG. 8A) for a given semiconductor device than a ceramic package.

The mounting flanges, in their deflected position, exert a resilient force on the heat sink urging base 30 of the heat sink into intimate thermal contact with aligned pad 20 of the electronic device package. The force urging the heat sink into contact with the electronic device package may be determined by the choice of material, size, angle of inclination and shape of the mounting flanges. One of the primary advantages of this invention is that the force securing the heat sink on the electronic device package is applied directly to the base of the heat sink and to the thermal pad of the electronic device package, if the package is so equipped. This insures that heat transfer between the electronic device package and the heat sink is maximized. Although not illustrated, a layer of a thermally conductive material such as a grease or a polymer sheet may be interposed between the base of the heat sink and the electronic device package to enhance thermal transfer. Another advantage of this invention is that the attachment clip provides a positive alignment on the heat sink securing it to the electronic device package in a desired position as opposed to conventional clips mounted on the heat sink which merely rely on frictional contact with the electronic device package.

FIG. 9 illustrates an alternative embodiment of the invention in which body 50' of the attachment clip is formed with a convex or bowed shape with respect to the longitudinal axis of the attachment clip. In this embodiment the mounting flanges of the heat sink may be formed in a horizontal plane with the base thereof parallel with the upper side of the electronic device package when adjacent thereto. When the attachment clip is attached to the heat sink, as herein described, the body of the attachment clip is deflected so as to be parallel with the underside of the electronic device package. In this position the attachment clip exerts a resilient force on the heat sink, urging the heat sink base into good thermal contact with the electronic device package. In all other respects the attachment clip of this embodiment is as hereinabove described.

Figure 10:
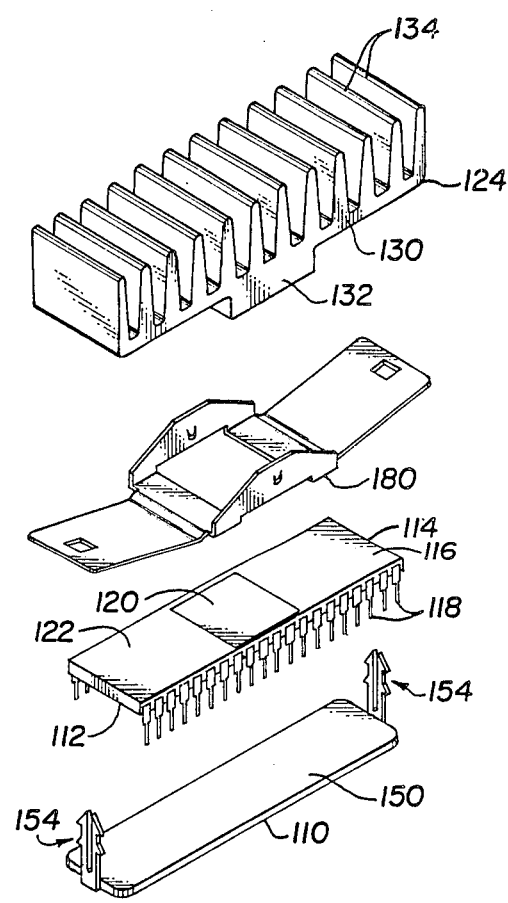
FIG. 10 is an exploded perspective view of an alternate embodiment of the heat sink clip assembly with an electronic device package according to this invention.

FIG. 10 illustrates an alternative embodiment of the invention in which the heat sink clip assembly includes an attachment clip 110 substantially identical to the attachment clip illustrated in FIG. 1. The attachment clip 110 is adapted for placement adjacent underside 112 of electronic device package 114 containing a semiconductor device (not shown). In the illustrated embodiment, the electronic device package is a DIP package carrying an integrated circuit device within rectangular housing 116. A plurality of leads 118 extend downwardly in two parallel rows along the longitudinal edges of the electronic device package. Pad 120 is formed on upper side 122 of the electronic device package and is in thermal contact with the integrated circuit device within the package for extracting heat generated during use.

Heat sink 124 is adapted for placement adjacent the upper side of the electronic device package. Heat sink 124 includes a base 130 having a standoff 132 formed on the underside thereof for substantially coextensive contact with pad 120 when the heat sink is located on the electronic device package. A plurality of transverse, upwardly extending fins 134 project from the upper side of the heat sink base and are adapted for rapid dissipation of heat from the heat sink base. Of course, other heat sink configurations may be employed, including a plurality of parallel upwardly projecting fins extending longitudinally along the heat sink base. However, the illustrated configuration with transverse upwardly extending fins enables the heat sink to be constructed by efficient manufacturing processes such as extrusion. When the standoff of the heat sink base is placed in intimate thermal contact with the pad of the electronic device package, heat generated by the semiconductor device within the package during use is conducted through the pad, heat sink base and the fins for rapid convection and/or radiation to the atmosphere. The heat sink may be anodized or otherwise surface treated to protect the heat sink from corrosion and to enhance the thermal dissipation characteristics of the heat sink.

Attachment clip 110 includes a generally rectangular body 150 preferably constructed of resilient material having high strength. The attachment clip is preferably constructed of electrically nonconductive heat resistant material. Alternatively, the attachment clip may be constructed of resilient metallic material coated with electrically nonconductive material to insulate the attachment clip from leads of the electronic device package.

The body of the attachment clip is narrower than the electronic device package so that the clip may be placed in contact with underside 112 of the package between the parallel rows of leads 118 extending downwardly therefrom. Preferably, the width of the attachment clip is sufficiently close to the distance between the parallel rows of leads on the electronic device package so as to laterally align the attachment clip with respect to the package.

Means are also provided to latch the heat sink to the attachment clip and maintain the heat sink in intimate thermal contact with the electronic device package. In the embodiment of the invention illustrated in FIGS. 10-14, the latching means includes a pair of longitudinally spaced barb members 154 projecting from the attachment clip. The barb members are preferably positioned on the attachment clip body closely adjacent the ends of the integrated circuit housing when the attachment clip is in position so as to longitudinally align the attachment clip with respect to the electronic device package. Each of the barb members 154 corresponds in function and structure with the barb members 54 shown in FIGS. 1-8A and hereinabove described and therefore will not be discussed in greater detail.

Figure 11:
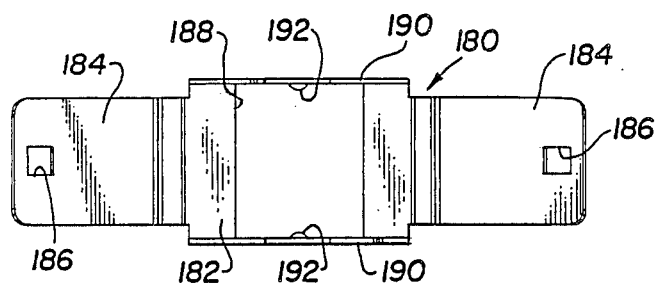
FIG. 11 is a top view of the spring clip of FIG. 10.
Figure 12:
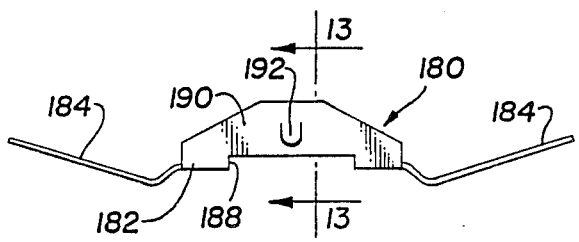
FIG. 12 is a side view of the spring clip of FIG. 10.
Figure 13:
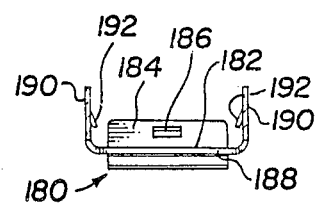
FIG. 13 is a cross-sectional view taken along plane 13—13 of the spring clip of FIG. 10.

The latching means of this embodiment also includes spring clip 180 shown in greater detail in FIGS. 11-13. The spring clip 180 includes base portion 182 and longitudinally extending upwardly deflected spring members 184 projecting from opposite ends of the base portion. Each spring member includes an aperture 186. The spring clip may be placed on top of the electronic device package opposite the attachment clip and the spring members manually deflected downwardly so that the barb members 154 on the attachment clip each penetrate and engage one of the aligned apertures 186 in the spring members. Thus the spring clip is secured to the attachment clip with the electronic device package securely interposed and positioned therebetween.

Figure 14:
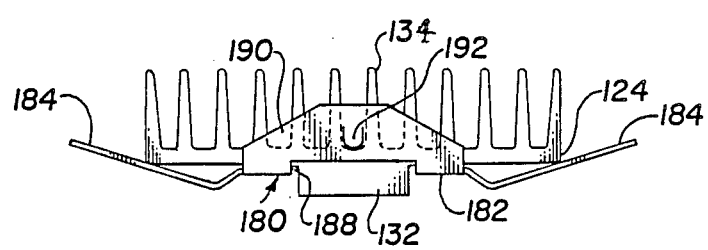
FIG. 14 is a side view of the heat sink clip assembly of FIG. 10.

The spring clip further includes central opening 188 which exposes pad 120 on the electronic device package when the spring clip is mounted on the package. A pair of laterally spaced upwardly extending side flanges 190 are integrally formed on the spring clip. Each side flange includes an inwardly projecting tang 192. As shown in FIG. 14 the side flanges receive the base of the heat sink therebetween with the respective tangs extending between a pair of the upwardly projecting fins and contacting the top of the heat sink base to secure the heat sink to the device package. The heat sink may be removed, if desired, by manually deflecting the flanges outwardly to release the base of the heat sink.

The standoff portion 132 of the heat sink, once engaged with the spring clip, is resiliently urged downwardly through opening 188 of the spring clip into intimate thermal contact with pad 120 of the electronic device package by the resilient force exerted by the spring clip in conjunction with the attachment clip. The force urging the heat sink into contact with the electronic device package may be determined by the choice of material, size, angle and inclination of the mounting flanges. In the illustrated embodiment the height of the standoff portion 132 of the heat sink provides clearance for the upwardly deflected spring members when the heat sink and spring clip are pre-assembled to each other prior to engagement with the attachment clip and electronic device package. Of course, it is recognized that the spring members of the spring clip of the embodiment shown in FIGS. 10-14 may be formed without an upward deflection and the attachment clip given a convex bow as illustrated in the embodiment of FIG. 9 without affecting the structure and function of the remainder of the invention. Alternatively, the spring clip and the attachment clip may be pre-assembled to each other with the electronic device package interposed and the heat sink later engaged with the spring clip. In such cases, the standoff portion of the heat sink may be reduced or eliminated.

It will be appreciated that the heat sink may take many forms. It is only necessary that the base of the heat sink have a portion adapted for intimate contact with the electronic device package to remove heat. As shown in FIGS. 1-4 the base 30 and flanges 36 are integral parts of the heat sink. However, it will be readily recognized that the base 30 and flanges 36 may be formed as discrete unitary parts to which additional heat dissipating elements, such as stamped on extruded parts, are secured. Furthermore, it will be appreciated that the base 30 need not necessarily directly contact the electronic device package. Instead, a separate heat sink body may be interposed between base 30 and the electronic device package. Such heat sink bodies may be either permanently secured to base 30 or merely secured in place by the pressure applied thereto by the latching device attached to flanges 36. In any arrangement, however, the portion of the heat sink clip assembly contacting the electronic device package is considered to be the base of the heat sink for purposes of describing and claiming the invention.

While the invention has been described with particular reference to latching means comprising a barb member or the like in the lower attachment clip body which mates with an aperture, slot or the like in the heat sink base or spring clip, it will be readily recognized that the arrangement of the latching means may be reversed. For example, the body of the attachment clip may be formed with a pair of longitudinally spaced apertures or slots and the heat sink or spring clip include a pair of aligned latching members similar to the barb members illustrated in FIGS. 8 and 8A. The heat sink may be attached to the attachment clip by engaging each of the barb mmbers with one of the aligned apertures or slots in the body of the attachment clip.

Although the invention has been described above with regard to particular and preferred embodiments, these are advanced for illustrative purposes only and are not intended to limit the scope of this invention. The terms "under", "upper" and all other directional terms are not to limit the possible orientation of the electronic device package, heat sink or attachment clip during use. More than one barb member or other latching means may be formed on either end of the attachment clip for engagement with a like number of mating devices in the heat sink mounting flanges. Similarly, each barb member may be formed with a single barb element adapted to engage an opening in the heat sink mounting. Furthermore, the barbs on the various barb elements may be directed inwardly or outwardly. In the embodiment of the attachment clip shown in FIGS. 1-8A, the mounting flanges may be omitted and the openings for the barb members formed in the base or other portions of the heat sink. Accordingly, it is to be understood that the forms of the invention shown and described in detail are to be taken as preferred embodiments and that various changes and modifications may be resorted to without departing from the spirit and scope of the invention as defined by the appended claims.

What is claimed:

1. The combination comprising:
   (a) an electronic device package;
   (b) a heat sink located on one side of said electronic device package, said heat sink having a base in intimate thermal contact with said electronic device package;
   (c) a spring clip located on said electronic device package adjacent said heat sink and gripping said heat sink;
   (d) an attachment clip located on an opposite side of said electronic device package from said heat sink and said spring clip; and
   (e) means for latching said attachment clip to said spring clip with the electronic device package interposed therebetween and with said heat sink in intimate thermal contact with said electronic device package.

2. Heat sink assembly apparatus comprising:
   (a) a heat sink including a base adapted to mate with one surface of an electronic device package;
   (b) an elongated electrically non-conductive attachment body adapted for placement adjacent the electronic device package opposite said heat sink;
   (c) clip means having a base adapted for placement adjacent the electronic device package opposite said attachment body including a pair of laterally spaced side flanges extending from said base and adapted to receive said heat sink therebetween, each side flange including an inwardly extending tang adapted to engage the base of said heat sink; and
   (d) latching means adapted to secure said clip means to said attachment body with the electronic device package interposed therebetween and to maintain the base of said heat sink in intimate thermal contact with said electronic device package.

3. Heat sink apparatus for use in connection with DIP components comprising:
   (a) an elongated electrically insulating member adapted for placement between the rows of leads adjacent the underside of a DIP and to extend beyond both ends of the DIP;
   (b) a heat sink having a base portion adapted to contact the DIP on the top side thereof; and
   (c) latching means adapted to secure each end of said elongated insulating member to said heat sink and maintain said DIP securely fastened between said elongated insulating member and said base portion of said heat sink.

4. Apparatus as defined in claim 3 wherein said elongated insulating member is a resilient arcuate body adapted to be positioned with the convex surface thereof adjacent the DIP.

5. Apparatus as defined in claim 3 wherein said heat sink includes a flange extending from each end of said base portion adapted to extend beyond the ends of the DIP and in substantial alignment with the ends of said elongated insulating member.

6. Apparatus as defined in claim 5 wherein said flanges are inclined at an acute angle with respect to said base portion in a direction away from said elongated insulating member.

7. Apparatus as defined in claim 3 wherein said latching means comprises a barbed member extending from each end of said elongated insulating member adapted to engage an aperture in one end of said heat sink.

8. Apparatus as defined in claim 3 wherein said latching means comprises a barbed member extending from each end of said heat sink adapted to engage an aperture in one end of said elongated insulating member.

9. The combination comprising:
   (a) an electronic device package having oppositely disposed top and bottom sides with leads extending therefrom in the direction of said bottom side;
   (b) a heat sink located on the top side of said electronic device package, said heat sink having a base portion in intimate thermal contact with said electronic device package;
   (c) an electrically non-conductive attachment body located on the bottom side of said electronic device package from said heat sink; and
   (d) latching means securing said heat sink to said attachment body with the electronic device package interposed therebetween.

* * * * *